United States Patent
Liao

(10) Patent No.: US 11,581,851 B2
(45) Date of Patent: Feb. 14, 2023

(54) RELAXATION OSCILLATOR THAT SAMPLES VOLTAGE DIFFERENCE BETWEEN VOLTAGES GENERATED BY RESISTOR-CAPACITOR CHARGING AND DISCHARGING FOR CONTROLLING OUTPUT CLOCK FREQUENCY OF CONTROLLABLE OSCILLATOR AND ASSOCIATED RELAXATION OSCILLATION METHOD

(71) Applicant: MEDIATEK INC., Hsin-Chu (TW)

(72) Inventor: Fan-Wei Liao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/525,943

(22) Filed: Nov. 14, 2021

(65) Prior Publication Data
US 2022/0360220 A1    Nov. 10, 2022

Related U.S. Application Data

(60) Provisional application No. 63/185,405, filed on May 7, 2021.

(51) Int. Cl.
*H03B 5/20* (2006.01)
*G06F 1/04* (2006.01)

(52) U.S. Cl.
CPC ............... *H03B 5/20* (2013.01); *G06F 1/04* (2013.01)

(58) Field of Classification Search
CPC .... G06F 1/04; H03B 5/20; H03B 5/24; H03K 3/0231
See application file for complete search history.

(56) References Cited

U.S. PATENT DOCUMENTS 6,342,817 B1    1/2002 Crofts
8,373,502 B1    2/2013 Chen
(Continued)

FOREIGN PATENT DOCUMENTS

CN      107332541 A     11/2017
EP       3 813 263 A1    4/2021
WO      2021/000064 A1   1/2021

OTHER PUBLICATIONS

Tokunaga, "An On-Chip CMOS Relaxation Oscillator with Power Averaging Feedback Using a Reference Proportional to Supply Voltage", ISSCC 2009 / SESSION 23 / PLLs And Clocks / 23.8, pp. 404-405 and a page including Figure 23.8.7, 2009.

(Continued)

*Primary Examiner* — Levi Gannon
(74) *Attorney, Agent, or Firm* — Winston Hsu

(57) ABSTRACT

A relaxation oscillator includes a resistor-capacitor (RC) circuit, an integration capacitor, a sampling circuit, and a controllable oscillator. The RC circuit performs an RC charging operation to set a first voltage, performs an RC discharging operation to set a second voltage, and performs a reset operation to reset the first voltage to a first reference voltage and reset the second voltage to a second reference voltage. The sampling circuit performs a charge delivery operation to sample a voltage difference between the first voltage and the second voltage, and transfers the voltage difference to the integration capacitor. The controllable oscillator generates an output clock in response to a control input provided by the integration capacitor.

20 Claims, 13 Drawing Sheets

(56) References Cited

U.S. PATENT DOCUMENTS

| | | | |
|---|---|---|---|
| 8,378,752 B2* | 2/2013 | Sako | H03L 7/00 |
| | | | 331/34 |
| 9,444,468 B2* | 9/2016 | Astrom | H03K 3/0231 |
| 10,461,724 B2 | 10/2019 | Hurwitz | |
| 2002/0041217 A1* | 4/2002 | Crofts | H03K 4/023 |
| | | | 331/175 |
| 2012/0161868 A1* | 6/2012 | Yayama | H03L 1/00 |
| | | | 330/252 |
| 2012/0249114 A1* | 10/2012 | Sako | H03L 1/022 |
| | | | 323/312 |
| 2015/0349710 A1* | 12/2015 | Wang | H03K 3/0231 |
| | | | 331/143 |
| 2017/0214392 A1* | 7/2017 | Lee | H03K 3/012 |
| 2018/0351509 A1* | 12/2018 | Zhang | H03K 3/0231 |
| 2019/0028110 A1* | 1/2019 | Verlinden | H03L 7/097 |
| 2020/0119720 A1 | 4/2020 | Mikulic | |

OTHER PUBLICATIONS

Denier, "Analysis and Design of an Ultralow-Power CMOS Relaxation Oscillator", IEEE Transactions On Circuits and Systems—1: Regular Papers, vol. 57, No. 8, pp. 1973-1982, Aug. 2010.

Hsiao, "A 32.4 ppm/°C 3.2-1.6V Self-chopped Relaxation Oscillator with Adaptive Supply Generation", pp. 14-15, 2012 Symposium on VLSI Circuits Digest of Technical Papers.

Tokairin, "A 280nW, 100kHz, 1-Cycle Start-up Time, On-chip CMOS Relaxation Oscillator Employing a Feedforward Period Control Scheme", pp. 16-17, 2012 Symposium on VLSI Circuits Digest of Technical Papers.

Chiang, "A Submicrowatt 1.1-MHz CMOS Relaxation Oscillator With Temperature Compensation", IEEE Transactions on Circuits and Systems—II: Express Briefs, vol. 60, No. 12, pp. 837-841, Dec. 2013.

Paidimarri, "A 120nW 18.5kHz RC Oscillator with Comparator Offset Cancellation for ±0.25% Temperature Stability", ISSCC 2013 / SESSION 10 / Analog Techniques / 10.7, pp. 184-185 and a page including Figure 10.7.7.

Chiang, "Nanopower CMOS Relaxation Oscillators With Sub-100 ppm/°C Temperature Coefficient", IEEE Transactions on Circuits and Systems—II: Express Briefs, vol. 61, No. 9, pp. 661-665, Sep. 2014.

Jeong, "A 5.8nW, 45ppm/°C On-Chip CMOS Wake-up Timer Using a Constant Charge Subtraction Scheme", 2014 IEEE.

Griffith, "A 190nW 33kHz RC Oscillator with ±0.21% Temperature Stability and 4ppm Long-Term Stability", ISSCC 2014 / SESSION 17 / Analog Techniques / 17.8, pp. 300-301 and a page including Figure 17.8.7.

Dai, "A 14.4nW 122KHz Dual-phase Current-mode Relaxation Oscillator for Near-Zero-Power Sensors", 2015 IEEE.

Choi, "A 99nW 70.4kHz Resistive Frequency Locking On-Chip Oscillator with 27.4ppm/°C Temperature Stability", pp. C238-C239, 2015 Symposium on VLSI Circuits Digest of Technical Papers.

Scholl, "A 80 nW, 32 kHz Charge-Pump based Ultra Low Power Oscillator with Temperature Compensation", pp. 343-346, 2016 IEEE.

Asano, "A 1.66-nW/kHz, 32.7-kHz, 99.5ppm/°C Fully Integrated Current-Mode RC Oscillator for Real-Time Clock Applications with PVT Stability", pp. 149-152, 2016 IEEE.

Lee, "A 1.4V 10.5MHz Swing-Boosted Differential Relaxation Oscillator with 162.1dBc/Hz FOM and 9.86psrms Period Jitter in 0.18μm CMOS", ISSCC 2016 / SESSION 5 / Analog Techniques / 5.10, pp. 106-107 and a page including Figure 5.10.7.

Jang, "A 4.7nW 13.8ppm/°C Self-Biased Wakeup Timer Using a Switched-Resistor Scheme", ISSCC 2016 / SESSION 5 / Analog Techniques / 5.8, pp. 102-103 and a page including Figure 5.8.7.

Savanth, "A 0.68nW/kHz Supply-Independent Relaxation Oscillator with ±0.49%/V and 96ppm/°C Stability", ISSCC 2017 / SESSION 5 / Analog Techniques / 5.6, pp. 96-97 and a page including Figure 5.6.7.

Yat-Hei Lam et al., A 16.6μW 32.8MHz Monolithic CMOS Relaxation Oscillator, IEEE Asian Solid-State Circuits Conference, Nov. 10-12, 2014, Kaohsiung, Taiwan, 2014 IEEE, p. 161-164, XP032719792.

* cited by examiner

RELAXATION OSCILLATOR THAT SAMPLES VOLTAGE DIFFERENCE BETWEEN VOLTAGES GENERATED BY RESISTOR-CAPACITOR CHARGING AND DISCHARGING FOR CONTROLLING OUTPUT CLOCK FREQUENCY OF CONTROLLABLE OSCILLATOR AND ASSOCIATED RELAXATION OSCILLATION METHOD

CROSS REFERENCE TO RELATED APPLICATIONS

This application claims the benefit of U.S. provisional application No. 63/185,405, filed on May 7, 2021 and incorporated herein by reference.

BACKGROUND

The present invention relates to an oscillator design, and more particularly, to a relaxation oscillator that samples a voltage difference between voltages generated by resistor-capacitor (RC) charging and discharging for controlling an output clock frequency of a controllable oscillator and an associated relaxation oscillation method.

Many electronic devices operate using one or more clocks. These clocks are often generated using an oscillator. Many different oscillator types exist and can be implemented in different systems. Typical integrated circuits (ICs) often include one or more on-chip oscillators to develop clock signals. For example, a relaxation oscillator may be used to generate an output clock with a target frequency. One feature of the relaxation oscillator is that the relaxation oscillator is capable of generating the output clock without the need of a reference clock. A typical relaxation oscillator design may include a plurality of current sources and/or a continuous comparator. However, the continuous comparator is a power-hungry component, and the current source generally has high quiescent current. As a result, the typical relaxation oscillator design may fail to meet requirements of low-power applications. Thus, there is a need for an innovative ultra-low power relaxation oscillator design.

SUMMARY

One of the objectives of the claimed invention is to provide a relaxation oscillator that samples a voltage difference between voltages generated by resistor-capacitor (RC) charging and discharging for controlling an output clock frequency of a controllable oscillator and an associated relaxation oscillation method.

According to a first aspect of the present invention, an exemplary relaxation oscillator is disclosed. The exemplary relaxation oscillator includes a resistor-capacitor (RC) circuit, an integration capacitor, a sampling circuit, and a controllable oscillator. The RC circuit is arranged to perform an RC charging operation to set a first voltage, perform an RC discharging operation to set a second voltage, and perform a reset operation to reset the first voltage to a first reference voltage and reset the second voltage to a second reference voltage. The sampling circuit is arranged to perform a charge delivery operation to sample a voltage difference between the first voltage and the second voltage and transfer the voltage difference to the integration capacitor. The controllable oscillator is arranged to generate an output clock in response to a control input provided by the integration capacitor.

According to a second aspect of the present invention, an exemplary relaxation oscillation method is disclosed. The exemplary relaxation oscillation method includes: performing a resistor-capacitor (RC) charging operation to set a first voltage; performing an RC discharging operation to set a second voltage; performing a charge delivery operation to sample a voltage difference between the first voltage and the second voltage and transfer the voltage difference to an integration capacitor; in response to a control input provided by the integration capacitor, generating an output clock at a controllable oscillator; and performing a reset operation to reset the first voltage to a first reference voltage and reset the second voltage to a second reference voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
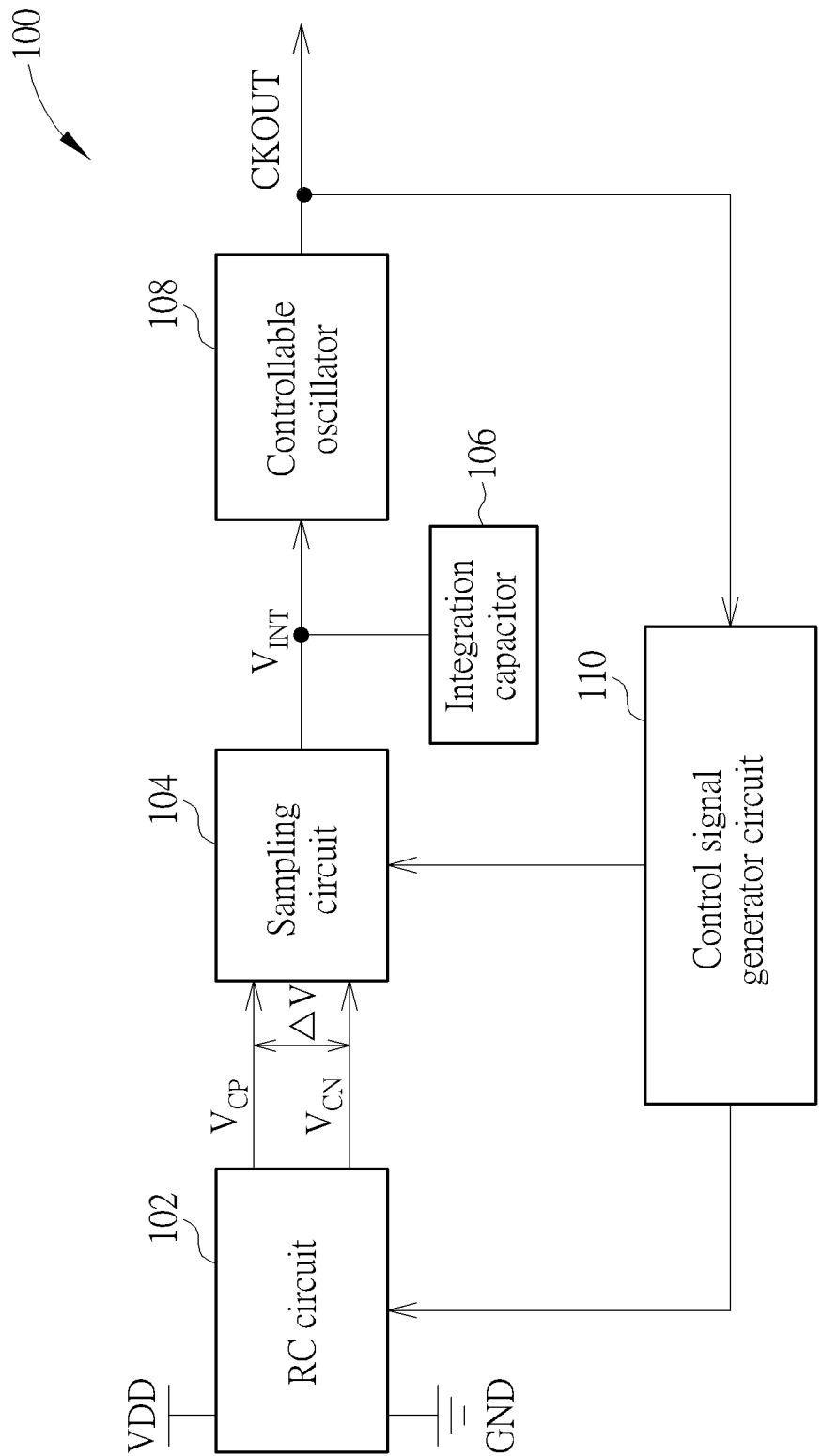
FIG. 1 is a block diagram illustrating fundamental architecture of a relaxation oscillator according to an embodiment of the present invention.

FIG. 1 is a block diagram illustrating fundamental architecture of a relaxation oscillator according to an embodiment of the present invention. The relaxation oscillator 100 includes a resistor-capacitor (RC) circuit 102, a sampling circuit 104, an integration capacitor 106, a controllable oscillator 108, and a control signal generator circuit 110. The RC circuit 102 includes resistor(s) and capacitor(s), and is arranged to perform an RC charging operation to set one voltage $V_{CN}$, perform an RC discharging operation to set another voltage $V_{CP}$, and perform a reset operation to reset the voltage $V_{CN}$ to one reference voltage such as a ground voltage GND and reset the voltage $V_{CP}$ to another reference voltage such as a supply voltage $V_{DD}$. For example, the RC circuit 102 may be implemented by a switched RC circuit. The sampling circuit 104 is arranged to perform a charge delivery operation to sample a voltage difference $\Delta V$ between two voltages $V_{CN}$ and $V_{CP}$ and transfer the voltage difference $\Delta V$ to the integration capacitor 106. For example, the sampling circuit 104 may be implemented by a unity-gain amplifier for amplifying the direct-current (DC) voltage. The controllable oscillator 108 is arranged to generate an output clock CKOUT in response to a control input (e.g., voltage input $V_{INT}$) provided by the integration capacitor 106. For example, the controllable oscillator 108 may be implemented by a voltage-controlled oscillator (VCO), and a frequency of the output clock CKOUT is controlled by the voltage input of the VCO. The control signal generator circuit 110 is arranged to generate control signals for controlling operation timing of circuit components included in the RC circuit 102 and the sampling circuit 104. For example, the control signal generator circuit 110 may refer to the output clock CKOUT for generating a plurality of clock signals as the control signals, where a frequency of each control signal is lower than a frequency of the output clock CKOUT.

In this embodiment, the output clock CKOUT is generated from the controllable oscillator 108 with the control input $V_{INT}$ provided by the integration capacitor 106. Hence, no power-hungry continuous comparator is needed by the proposed relaxation oscillator 100. In addition, the RC circuit 102 is used to provide two voltages $V_{CN}$ and $V_{CP}$ from which the voltage difference $\Delta V$ is sampled for controlling the control input $V_{INT}$ at the integration capacitor 106. Hence, no current source with high quiescent current is needed by the proposed relaxation oscillator 100. In a case where the RC circuit 102 is implemented by a switched RC circuit, the switched RC circuit may operate under an RC switching frequency much lower the frequency of the output clock CKOUT. Hence, the power requirement of the switched RC circuit can be relaxed. In addition, the bandwidth requirement and power requirement of the following sampling circuit 104 can be relaxed. The control signals generated from the control signal generator circuit 110 may be non-overlapping clock signals used for non-overlapping phase control of the proposed relaxation oscillator 100. Hence, the control signal generator circuit 110 can be implemented by a simple logic circuit for power saving. Furthermore, circuit components of the RC circuit 102 and the sampling circuit 104 are active during ON periods (logic high periods) of related control signals generated from the control signal generator circuit 110 and are inactive during OFF periods (logic low periods) of related control signals generated from the control signal generator circuit 110. In other words, all circuit components of the RC circuit 102 and the sampling circuit 104 are not always in operation, which results in lower power consumption. To put it simply, the relaxation oscillator 100 employs an ultra-low power relaxation oscillator design. Further details of the relaxation oscillator 100 are described with reference to the accompanying drawings.

Figure 2:
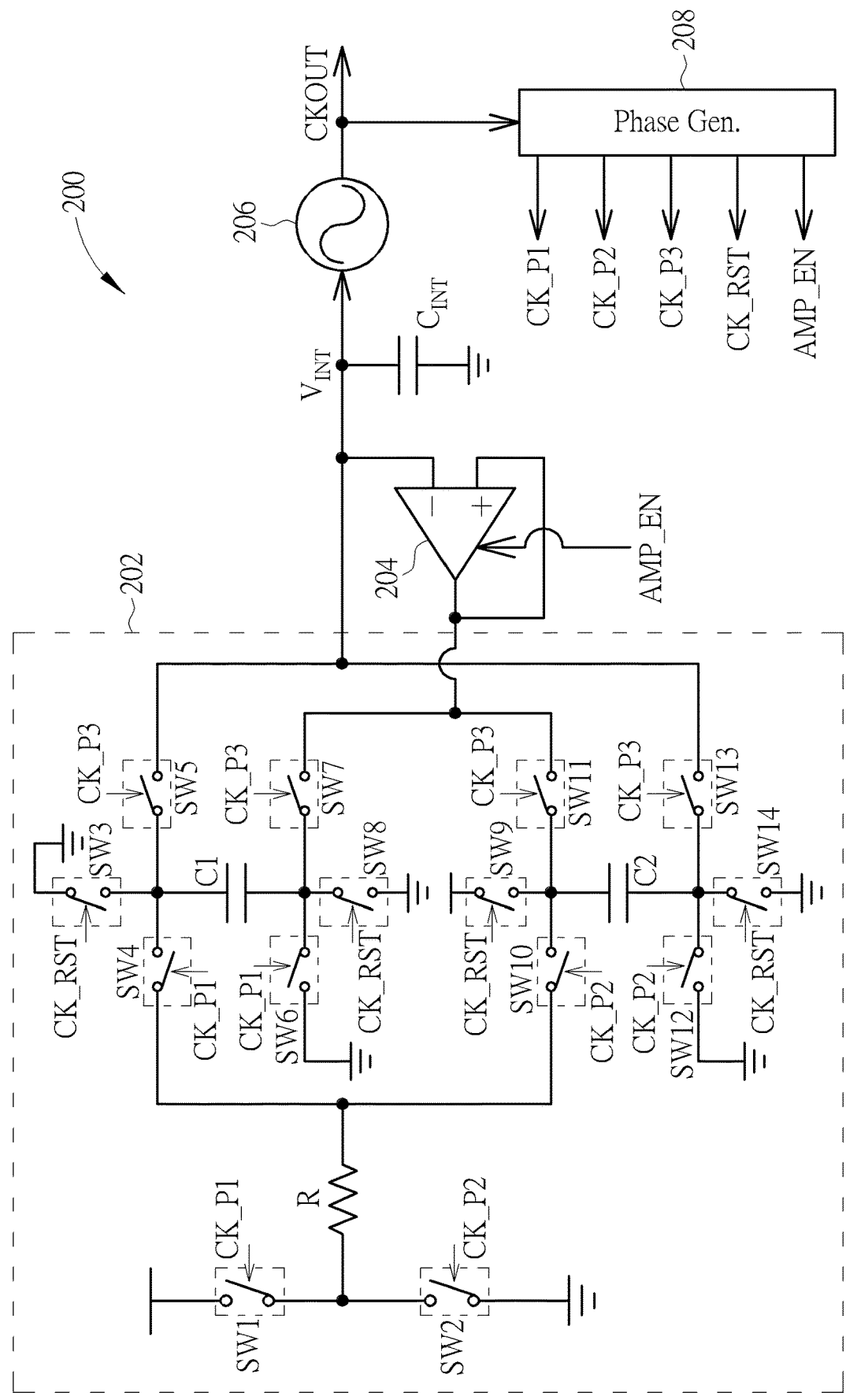
FIG. 2 is a diagram illustrating a circuit design of a relaxation oscillator according to an embodiment of the present invention.

FIG. 2 is a diagram illustrating a circuit design of a relaxation oscillator according to an embodiment of the present invention. The relaxation oscillator 200 is based on the fundamental architecture of the relaxation oscillator 100 shown in FIG. 1. For example, the RC circuit 102 shown in FIG. 1 may be implemented by a switched RC circuit 202 shown in FIG. 2, the sampling circuit 104 shown in FIG. 1 may be implemented by a unity-gain amplifier 204 shown in FIG. 2, the integration capacitor 106 shown in FIG. 1 may be implemented by an integration capacitor $C_{INT}$ shown in FIG. 2, the controllable oscillator 108 shown in FIG. 1 may be implemented by a VCO 206 shown in FIG. 2, and the control signal generator circuit 110 shown in FIG. 1 may be implemented by a phase generator circuit (labeled as "Phase Gen.") 208 shown in FIG. 2.

It should be noted that, using the unity-gain amplifier 204 to realize the sampling circuit 104 is for illustrative purposes only, and is not meant to be a limitation of the present invention. In practice, any means capable of sampling a voltage difference between voltages generated by RC charging and RC discharging and transferring the sampled voltage difference to the following integration capacitor may be employed to implement the sampling circuit 104. These alternative designs all fall within the scope of the present invention.

The switched RC circuit 202 includes a resistor R, a plurality of capacitors C1, C2, and a plurality of switches SW1, SW2, SW3, SW4, SW5, SW6, SW7, SW8, SW9, SW10, SW11, SW12, SW13, and SW14. In this embodiment, the switched RC circuit 202 employs dual-phase RC charging/discharging for area saving. For example, the resistor R is used in an RC charging phase and reused in an RC discharging phase. However, this is for illustrative purposes only, and is not meant to be a limitation of the present invention. Alternatively, the switched RC circuit 202 may be modified to have one resistor and one capacitor used in an RC charging phase and another resistor and another capacitor used in an RC discharging phase.

The switches SW1-SW14 may be categorized into several switch-based circuits. A switch-based circuit, having switches SW1, SW4, SW6, is controlled by a same switch control signal CK_P1. A switch-based circuit, having switches SW2, SW10, SW12, is controlled by a same switch control signal CK_P2. A switch-based circuit, having switches SW5, SW7, SW11, SW13, is controlled by a same switch control signal CK_P3. A switch-based circuit, having switches SW3, SW8, SW9, SW14, is controlled by a same switch control signal CK_RST. In addition, the unity-gain amplifier 204 is controlled by an amplifier enable control signal AMP_EN.

Figure 3:
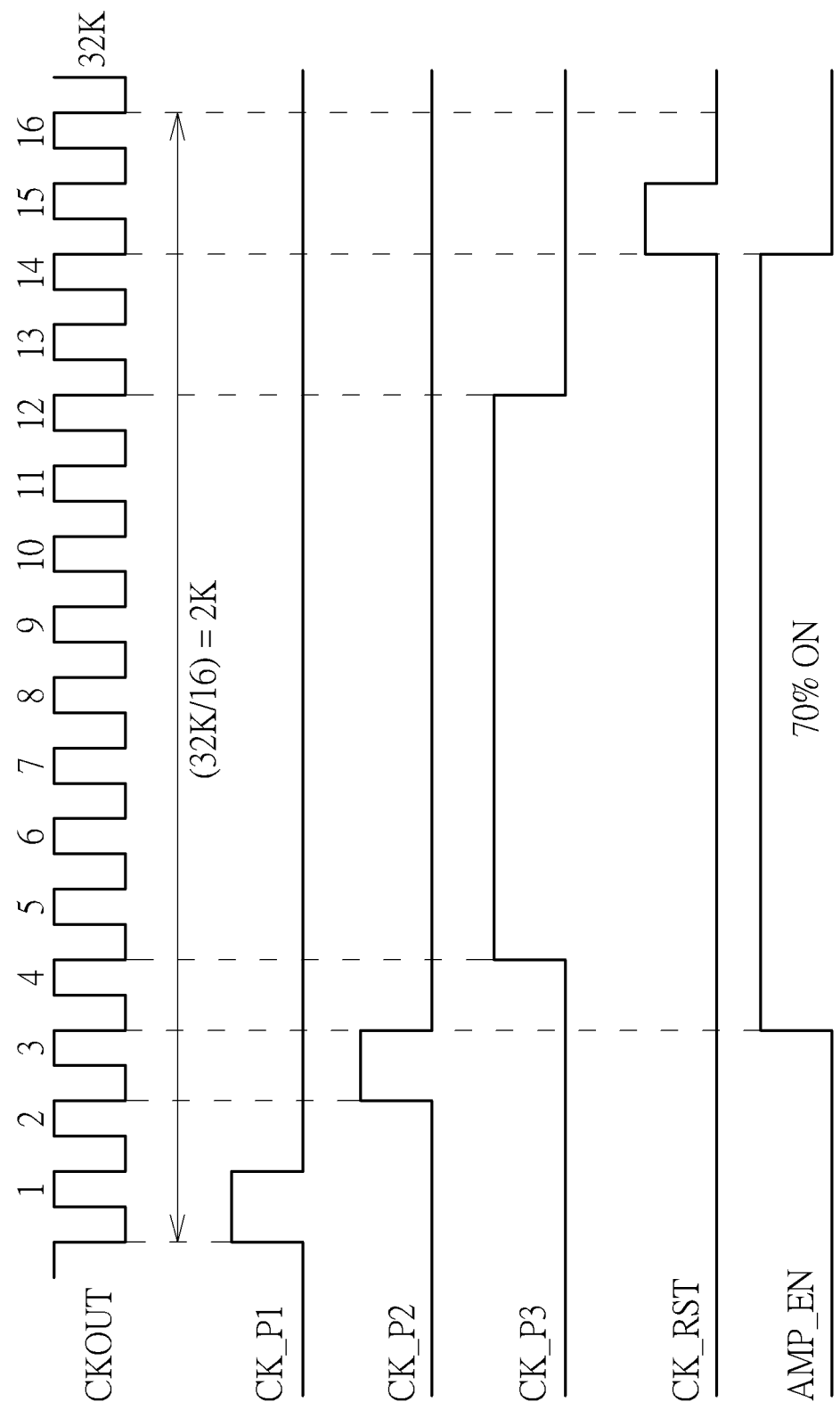
FIG. 3 is a waveform diagram illustrating an output clock, a plurality of switch control signals, and an amplifier reset control signal according to an embodiment of the present invention.

The switched RC circuit 202 is controlled by the switch control signals CK_P1, CK_P2, CK_P3, CK_RST and the unity-gain amplifier 204 is controlled by the amplifier enable control signal AMP_EN to enable the relaxation oscillator 200 to sequentially enter an RC charging phase, an RC discharging phase, a charge delivery phase, and a reset phase. An RC charging operation is performed at the switched RC circuit 202 during a first period (RC charging phase). An RC discharging operation is performed at the switched RC circuit 202 during a second period (RC discharging phase). A charge delivery operation is performed by the unity-gain amplifier 204 during a third period (charge delivery phase). A reset operation is performed at the switched RC circuit 202 during a fourth period (reset phase). The first period, and the second period, the third period, and the fourth period may be non-overlapping periods in the time domain. FIG. 3 is a waveform diagram illustrating the output clock CKOUT, the switch control signals CK_P1, CK_P2, CK_P3, CK_RST, and the amplifier reset control signal AMP_EN according to an embodiment of the present invention. The phase generator circuit 208 receives the output clock CKOUT, and generates the switch control signals CK_P1, CK_P2, CK_P3, CK_RST and the amplifier reset control signal AMP_EN according to the output clock CKOUT. The frequency of each of the switch control signals CK_P1, CK_P2, CK_P3, CK_RST and the amplifier reset control signal AMP_EN is lower than the frequency of the output clock CKOUT. For example, the frequency of the output clock CKOUT is 32K, and each of the switch control signals CK_P1, CK_P2, CK_P3, CK_RST and the amplifier reset control signal AMP_EN is a clock signal with a frequency lower than 32K.

At the switched RC circuit 202, the RC charging operation is performed when the switch control signal CK_P1 has a logic high level, and is not performed when the switch control signal CK_P1 has a logic low level. Specifically, the switches SW1, SW4, SW6 are switched on during an ON period of the switch control signal CK_P1 (CK_P1=1), and are switched off during an OFF period of the switch control signal CK_P1 (CK_P1=0). The RC charging operation is performed once per N clock cycles of the output clock CKOUT, where N is an integer larger than one. As shown in FIG. 3, the RC charging operation may be performed once per 16 clock cycles of the output clock CKOUT.

At the switched RC circuit 202, the RC discharging operation is performed when the switch control signal CK_P2 has a logic high level, and is not performed when the switch control signal CK_P2 has a logic low level. Specifically, the switches SW2, SW10, SW12 are switched on during an ON period of the switch control signal CK_P2 (CK_P2=1), and are switched off during an OFF period of the switch control signal CK_P2 (CK_P2=0). The RC discharging operation is performed once per N clock cycles of the output clock CKOUT, where N is an integer larger than one. As shown in FIG. 3, the RC discharging operation may be performed once per 16 clock cycles of the output clock CKOUT.

At the unity-gain amplifier 204, the charge delivery operation is performed when the switch control signal CK_P3 has a logic high level, and is not performed when the switch control signal CK_P3 has a logic low level. Specifically, the switches SW5, SW7, SW11, SW13 are switched on during an ON period of the switch control signal CK_P3 (CK_P3=1), and are switched off during an OFF period of the switch control signal CK_P3 (CK_P3=0). The charge delivery operation is performed once per N clock cycles of the output clock CKOUT, where N is an integer larger than one. As shown in FIG. 3, the charge delivery operation may be performed once per 16 clock cycles of the output clock CKOUT.

At the switched RC circuit 202, the reset operation is performed when the switch control signal CK_RST has a logic high level, and is not performed when the switch control signal CK_RST has a logic low level. Specifically, the switches SW3, SW8, SW9, SW14 are switched on during an ON period of the switch control signal CK_RST (CK_RST=1), and are switched off during an OFF period of the switch control signal CK_RST (CK_RST=0). The reset operation is performed once per N clock cycles of the output clock CKOUT, where N is an integer larger than one. As shown in FIG. 3, the reset operation may be performed once per 16 clock cycles of the output clock CKOUT.

Regarding the unity-gain amplifier 204, it is responsible for dealing with the charge delivery operation that transfers the voltage difference $\Delta V$ ($\Delta V = V_{CN} - V_{CP}$) from the preceding switched RC circuit 202 to the following integration capacitor $C_{INT}$. An ON period of the amplifier enable control signal AMP_EN overlaps an ON period of the switch control signal CK_P3, and is not shorter than the ON period of the switch control signal CK_P3. To ensure a stable operation of the unity-gain amplifier 204 during the charge delivery operation, a start time of the ON period of the amplifier enable control signal AMP_EN may be intentionally advanced to be earlier than a start time of the ON period of the switch control signal CK_P3, and an end time of the ON period of the amplifier enable control signal AMP_EN may be internally delayed to be later than an end time of the ON period of the switch control signal CK_P3. In this embodiment, one ON period of the amplifier enable control signal AMP_EN lasts for 11 clock cycles of the output clock CKOUT, which is approximately 70% of 16 clock cycles of the output clock CKOUT. In other words, the unity-gain amplifier 204 may be controlled by the amplifier enable control signal AMP_EN with 70% duty cycle for power saving. However, this is for illustrative purposes only, and is not meant to be a limitation of the present invention. Furthermore, the ON period of the amplifier enable control signal AMP_EN does not overlap any of the ON period of the switch control signal CK_P1, the ON period of the switch control signal CK_P2, and the ON period of the switch control signal CK_RST.

Figure 4:
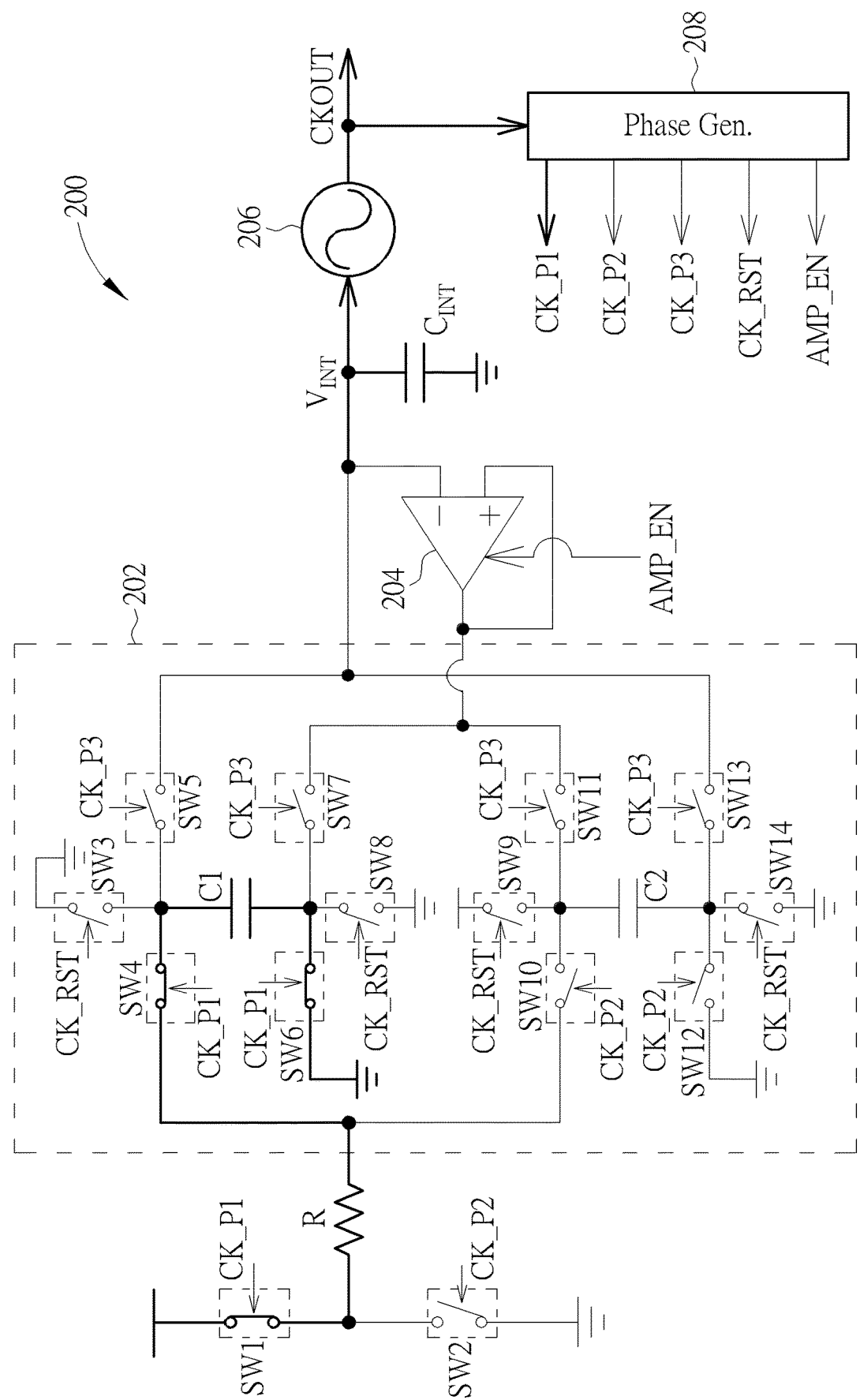
FIG. 4 is a diagram illustrating a relaxation oscillator operating under an RC charging phase according to an embodiment of the present invention.

The relaxation oscillator 200 may enter four phases (which include an RC charging phase, an RC discharging phase, a charge delivery phase, and a reset phase) sequentially and repeatedly, for reducing the frequency deviation of the output clock CKOUT and making the frequency of the output clock CKOUT have the target frequency value. FIG. 4 is a diagram illustrating the relaxation oscillator 200 operating under an RC charging phase according to an embodiment of the present invention. The switches SW1, SW4, SW6 are switched on by the switch control signal CK_P1 (CK_P1=1). The switches SW2, SW10, SW12 are switched off by the switch control signal CK_P2 (CK_P2=0), such that one end of the resistor R is disconnected from the reference voltage GND, one plate of the capacitor C2 is disconnected from another end of the resistor R, and another plate of the capacitor C2 is disconnected from the reference voltage GND. The switches SW5, SW7, SW11, SW13 are switched off by the switch control signal CK_P3 (CK_P3=0), such that two plates of the capacitor C1 and two plates of the capacitor C2 are all disconnected from the unity-gain amplifier 204. The switches SW3, SW8, SW9, SW14 are switched off by the switch control signal CK_RST (CK_RTS=0), such that one plate of the capacitor C1 is disconnected from the reference voltage GND, another plate of the capacitor C1 is disconnected from the reference voltage GND, one plate of the capacitor C2 is disconnected from the reference voltage $V_{DD}$, and another plate of the capacitor C2 is disconnected from the reference voltage GND. In addition, the unity-gain amplifier 204 is disabled by the amplifier enable control signal AMP_EN (AMP_EN=0).

Figure 5:
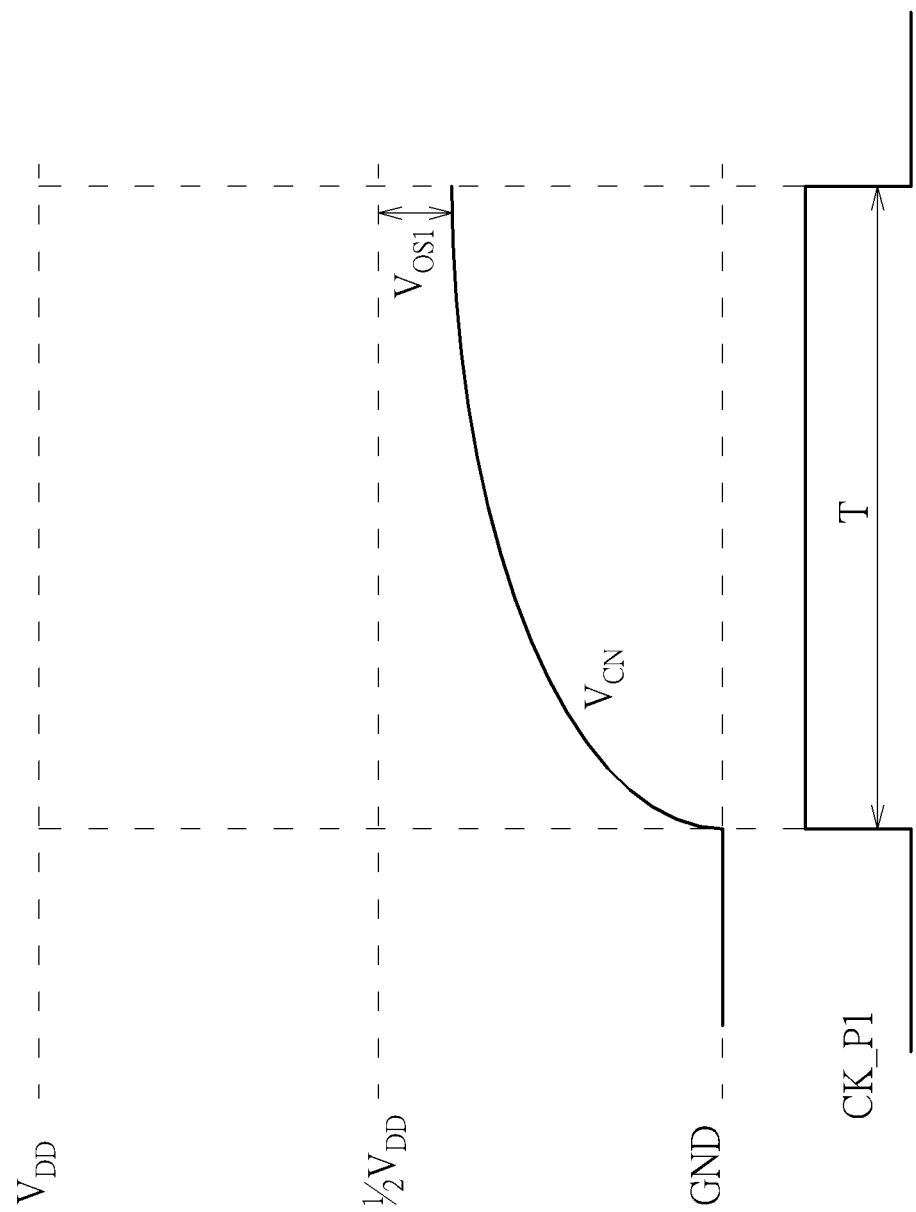
FIG. 5 is a diagram illustrating an RC charging operation according to an embodiment of the present invention.

During the period in which the RC charging operation is performed, one end of the resistor R is connected to the reference voltage $V_{DD}$, one plate of the capacitor C1 is connected to another end of the resistor R, and another plate of the capacitor C1 is connected to the reference voltage GND. Hence, the voltage $V_{CN}$ at one plate of the capacitor C1 is charged from an initial voltage level (e.g., reference voltage GND) through RC charging. FIG. 5 is a diagram illustrating an RC charging operation according to an embodiment of the present invention. The integration capacitor $C_{INT}$ is disconnected from the capacitors C1 and C2. Hence, the control input $V_{INT}$ at one plate of the integration capacitor $C_{INT}$ is not affected by the RC charging operation and remains unchanged. The VCO 206 generates the output clock CKOUT in response to the control input $V_{INT}$ held by the integration capacitor $C_{INT}$. The phase generator 208 generates the switch control signal CK_P1 according to the output clock CKOUT, where the length T of the ON period of the switch control signal CK_P1 depends on the frequency of the output clock CKOUT. Specifically, the length T of the ON period of the switch control signal CK_P1 is inversely proportional to the frequency of the output clock CKOUT. At the end of the RC charging operation, the voltage $V_{CN}$ at one plate of the capacitor C1 may be expressed by the following formula.

$$V_{CN} = V_{DD} \cdot \left(1 - e^{\frac{-T}{RC1}}\right) = \frac{1}{2}V_{DD} - V_{OS1} \quad (1)$$

In above formula (1), $$\frac{1}{2}V_{DD}$$

represents a target voltage level indicative of zero frequency deviation, and $V_{OS1}$ represents an offset resulting from frequency deviation.

Figure 6:
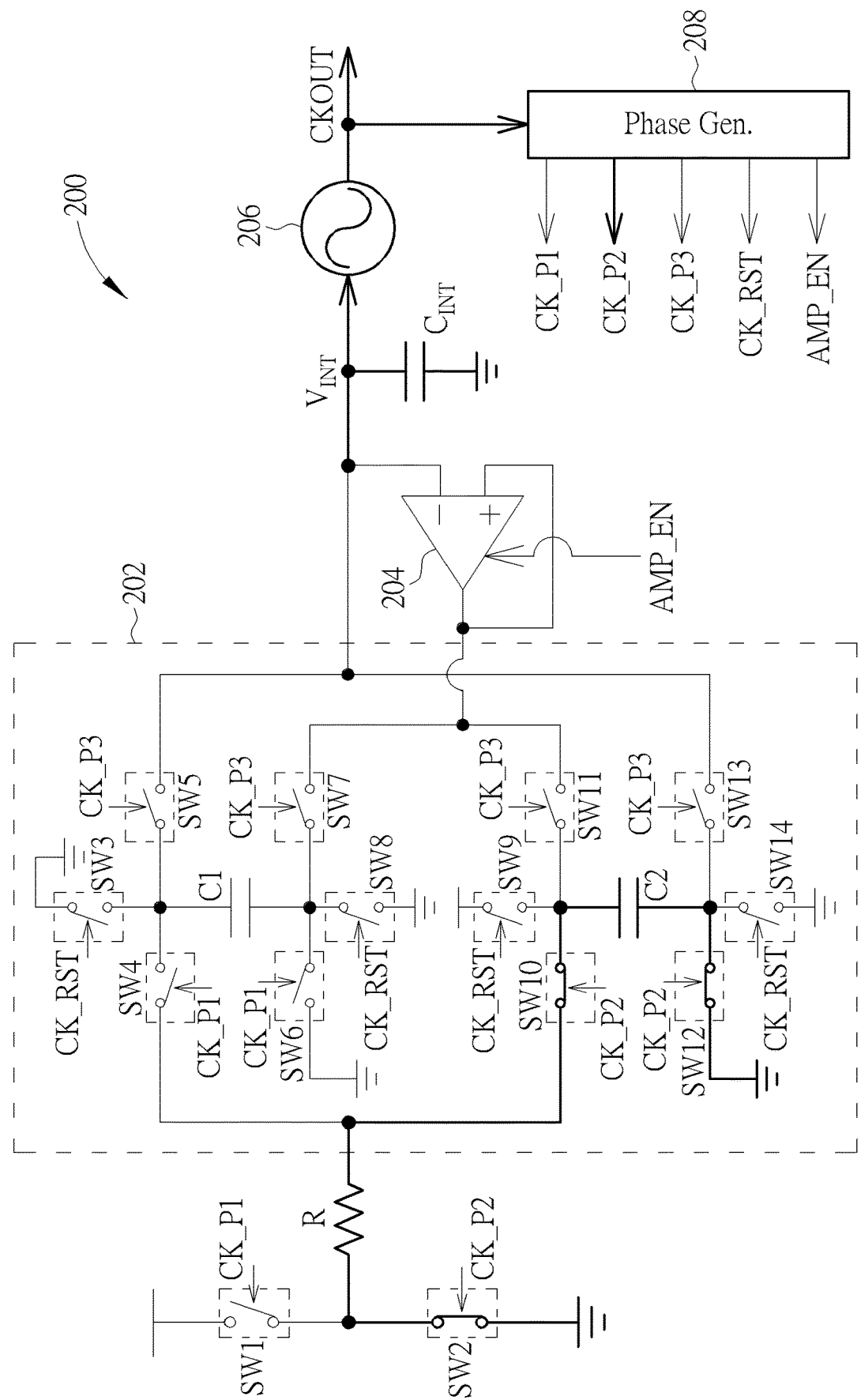
FIG. 6 is a diagram illustrating a relaxation oscillator operating under an RC discharging phase according to an embodiment of the present invention.

FIG. 6 is a diagram illustrating the relaxation oscillator 200 operating under an RC discharging phase according to an embodiment of the present invention. The switches SW2, SW10, SW12 are switched on by the switch control signal CK_P2 (CK_P2=1). The switches SW1, SW4, SW6 are switched off by the switch control signal CK_P1 (CK_P1=0), such that one end of the resistor R is disconnected from the reference voltage $V_{DD}$, one plate of the capacitor C1 is disconnected from another end of the resistor R, and another plate of the capacitor C1 is disconnected from the reference voltage GND. The switches SW5, SW7, SW11, SW13 are switched off by the switch control signal CK_P3 (CK_P3=0), such that two plates of the capacitor C1 and two plates of the capacitor C2 are all disconnected from the unity-gain amplifier 204. The switches SW3, SW8, SW9, SW14 are switched off by the switch control signal CK_RST (CK_RTS=0), such that one plate of the capacitor C1 is disconnected from the reference voltage GND, another plate of the capacitor C1 is disconnected from the reference voltage GND, one plate of the capacitor C2 is disconnected from the reference voltage $V_{DD}$, and another plate of the capacitor C2 is disconnected from the reference voltage GND. In addition, the unity-gain amplifier 204 is disabled by the amplifier enable control signal AMP_EN (AMP_EN=0).

Figure 7:
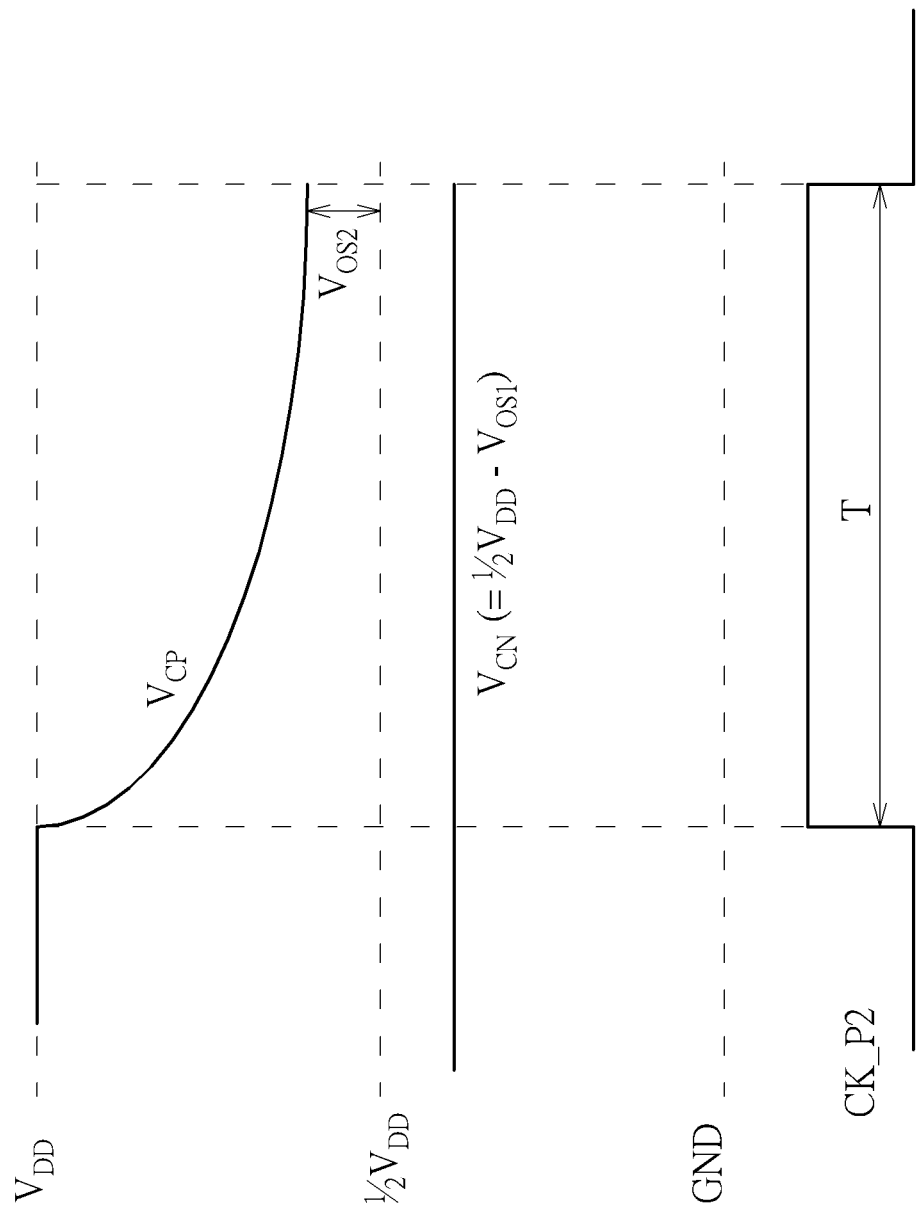
FIG. 7 is a diagram illustrating an RC discharging operation according to an embodiment of the present invention.

During the period in which the RC discharging operation is performed, one end of the resistor R is connected to the reference voltage GND, one plate of the capacitor C2 is connected to another end of the resistor R, and another plate of the capacitor C2 is connected to the reference voltage GND. Hence, the voltage $V_{CP}$ at one plate of the capacitor C2 is discharged from an initial voltage level (e.g., reference voltage $V_{DD}$) through RC discharging. FIG. 7 is a diagram illustrating an RC discharging operation according to an embodiment of the present invention. The integration capacitor $C_{INT}$ is disconnected from the capacitors C1 and C2. Hence, the control input $V_{INT}$ at one plate of the integration capacitor $C_{INT}$ is not affected by the RC discharging operation and remains unchanged. The VCO 206 generates the output clock CKOUT in response to the control input $V_{INT}$ held by the integration capacitor $C_{INT}$. The phase generator 208 generates the switch control signal CK_P2 according to the output clock CKOUT, where the length T of the ON period of the switch control signal CK_P2 is equal to the length T of the ON period of the switch control signal CK_P1, and also depends on the frequency of the output clock CKOUT. At the end of the RC discharging operation, the voltage $V_{CP}$ at one plate of the capacitor C2 may be expressed by the following formula.

$$V_{CP} = V_{DD} \cdot e^{\frac{-T}{RC2}} = \frac{1}{2}V_{DD} + V_{OS2} \quad (2)$$

In above formula (2), $$\frac{1}{2}V_{DD}$$

represents a target voltage level indicative of zero frequency deviation, and $V_{OS2}$ represents an offset resulting from frequency deviation.

After the RC charging phase and the RC discharging phase are completed, the relaxation oscillator 200 enters the charge delivery phase. If the current frequency of the output clock CKOUT is equal to the target frequency value, both of the voltage $V_{CN}$ obtained at the end of the RC charging operation and the voltage $V_{CP}$ obtained at the end of the RC discharging operation should be equal to the same voltage level $$\left(e.g., \frac{1}{2}V_{DD}\right).$$

If the voltage $V_{CN}$ obtained at the end of the RC charging operation is different from the voltage $V_{CP}$ obtained at the end of the RC discharging operation, it means that the current frequency of the output clock CKOUT is deviated from the target frequency value, and the control input $V_{INT}$ should be adjusted to compensate for the frequency deviation. In this embodiment, there is a voltage difference ΔV (ΔV=$V_{CN}$-$V_{CP}$=$V_{OS1}$+$V_{OS2}$) between the voltage $V_{CN}$ obtained at the end of the RC charging operation and the voltage $V_{CP}$ obtained at the end of the RC discharging operation, as illustrated in FIG. 5 and FIG. 7. The relaxation oscillator 200 enters the charge delivery phase for transferring the voltage difference ΔV to the integration capacitor $C_{INT}$. It should be noted that the voltage difference ΔV may be positive or negative, depending upon the length T of the ON period of the switch control signal CK_P1/CK_P2 (i.e., the frequency deviation direction of the output clock CKOUT).

Figure 8:
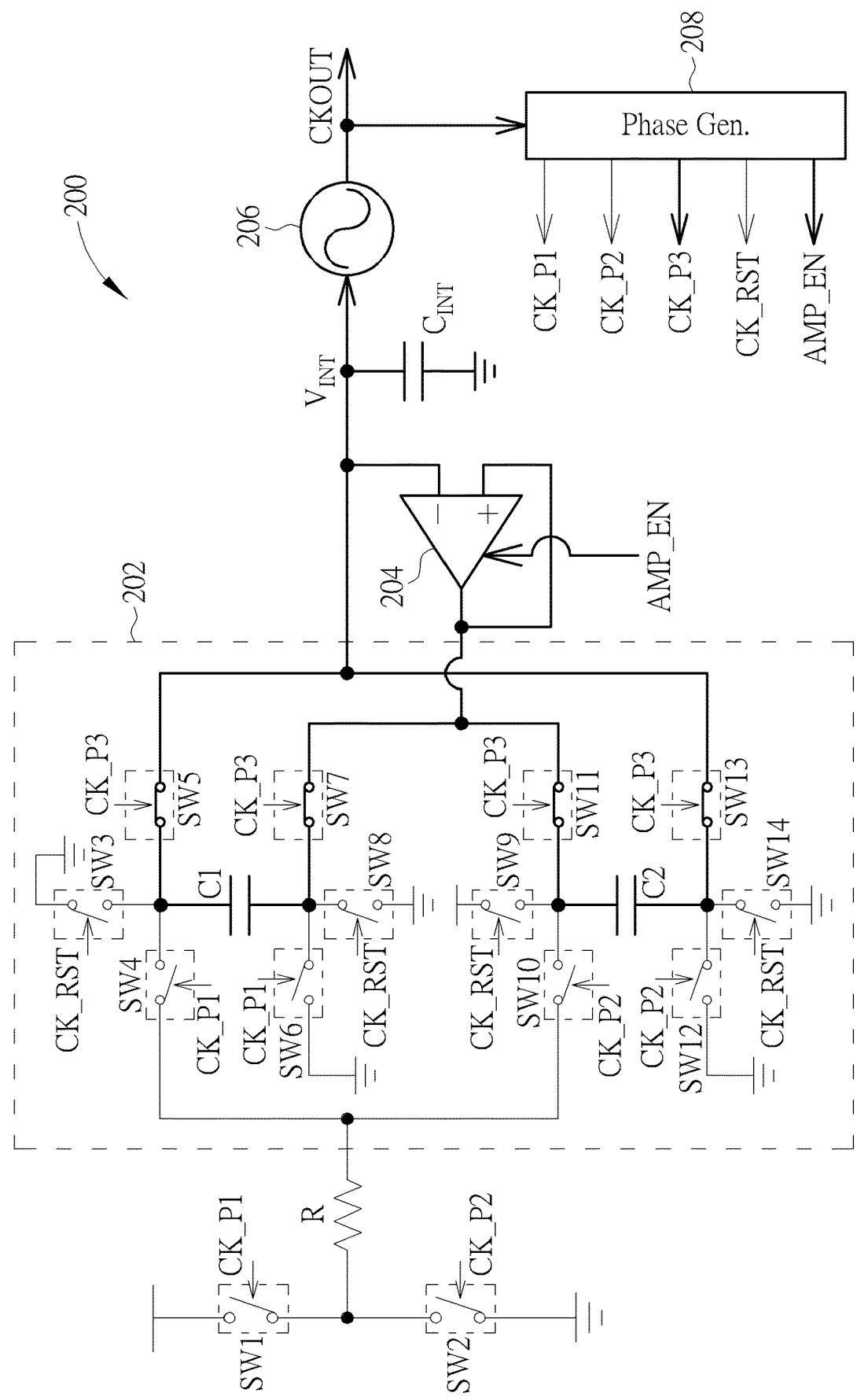
FIG. 8 is a diagram illustrating a relaxation oscillator operating under a charge delivery phase according to an embodiment of the present invention.

FIG. 8 is a diagram illustrating the relaxation oscillator 200 operating under a charge delivery phase according to an embodiment of the present invention. The switches SW5, SW7, SW11, SW13 are switched on by the switch control signal CK_P3 (CK_P3=1). The switches SW1, SW4, SW6 are switched off by the switch control signal CK_P1 (CK_P1=0), such that one end of the resistor R is disconnected from the reference voltage $V_{DD}$, one plate of the capacitor C1 is disconnected from another end of the resistor R, and another plate of the capacitor C1 is disconnected from the reference voltage GND. The switches SW2, SW10, SW12 are switched off by the switch control signal CK_P2 (CK_P2=0), such that one end of the resistor R is disconnected from the reference voltage GND, one plate of the capacitor C2 is disconnected from another end of the resistor R, and another plate of the capacitor C2 is disconnected from the reference voltage GND. The switches SW3, SW8, SW9, SW14 are switched off by the switch control signal CK_RST (CK_RST=0), such that one plate of the capacitor C1 is disconnected from the reference voltage GND, another plate of the capacitor C1 is disconnected from the reference voltage GND, one plate of the capacitor C2 is disconnected from the reference voltage $V_{DD}$, and another plate of the capacitor C2 is disconnected from the reference voltage GND. In addition, the unity-gain amplifier 204 is enabled by the amplifier enable control signal AMP_EN (AMP_EN=1).

During the period in which the charge delivery operation is performed by the unity-gain amplifier 204, one plate of the capacitor C1 and another plate of the capacitor C2 are both connected to the inverting input terminal (−) of the unity-gain amplifier 204, and one plate of the capacitor C2 and another plate of the capacitor C1 are both connected to the output terminal of the unity-gain amplifier 204, where the output terminal of the unity-gain amplifier 204 is coupled to a non-inverting terminal (+) of the unity-gain amplifier 204. Since two plates of the capacitor C1 are coupled to the output terminal and the inverting input terminal of the unity-gain amplifier 204, respectively, the unity-gain amplifier 204 is operative to make two plates of the capacitor C1 have the same voltage level, meaning that charges stored in the capacitor C1 will be removed. Similarly, since two plates of the capacitor C2 are coupled to the output terminal and the inverting input terminal of the unity-gain amplifier 204, the unity-gain amplifier 204 is operative to make two plates of the capacitor C2 have the same voltage level, meaning that charges stored in the capacitor C2 will be removed. In this embodiment, a charge difference $\Delta Q$ ($\Delta Q = \Delta V / C_{INT}$) resulting from the voltage difference $\Delta V$ ($\Delta V = V_{CN} - V_{CP} = V_{OS1} + V_{OS2}$) is applied to the integration capacitor $C_{INT}$ due to charge re-distribution among capacitors C1, C2, $C_{INT}$.

Figure 9:
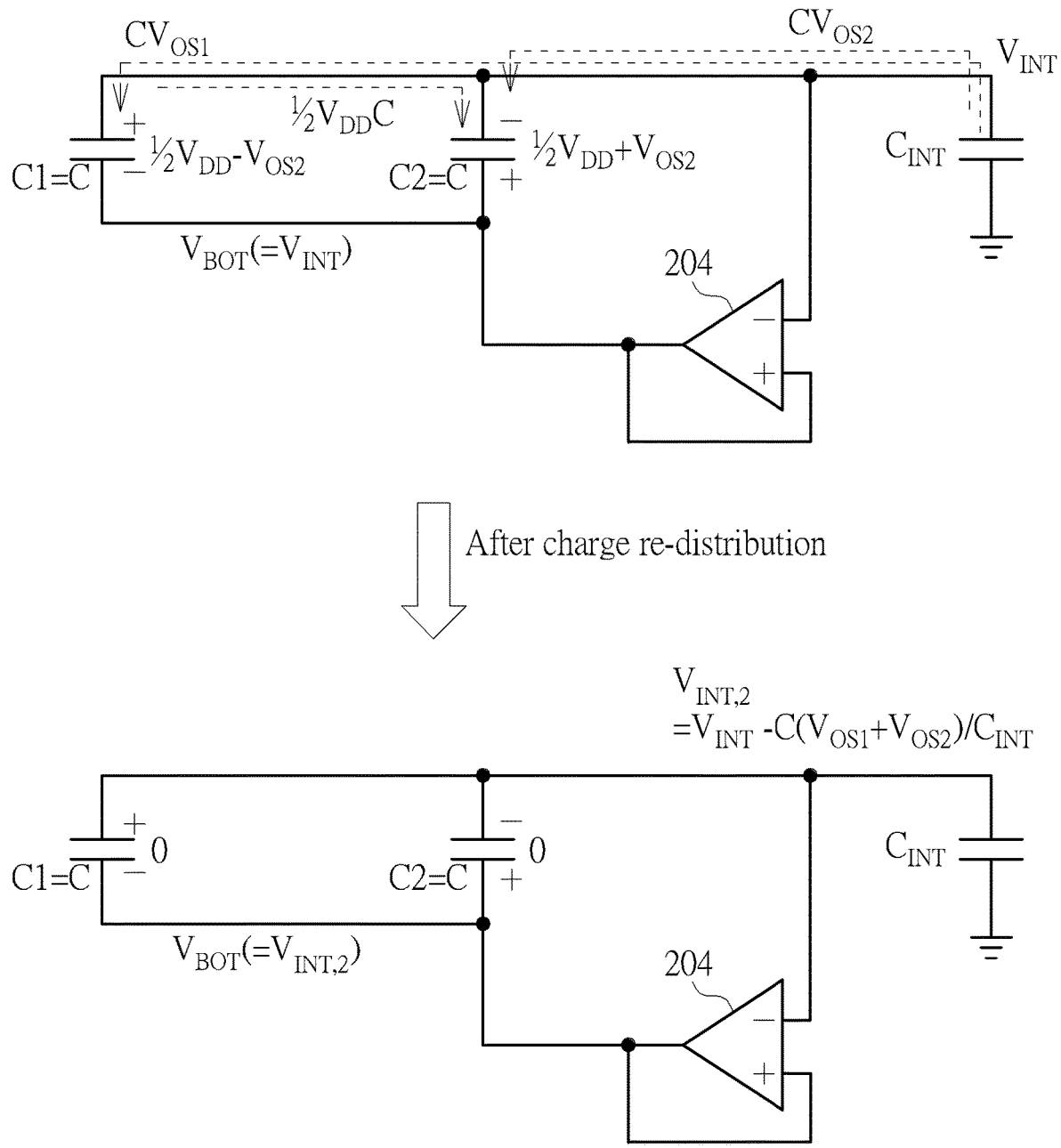
FIG. 9 is a diagram illustrating a charge delivery operation according to an embodiment of the present invention.

FIG. 9 is a diagram illustrating a charge delivery operation according to an embodiment of the present invention. The capacitors C1 and C2 may be configured to have the same capacitance value C. At the time the switches SW5, SW7, SW11, SW13 are switched on, the unity-gain amplifier 204 outputs the control input $V_{INT}$ held at the integration capacitor $C_{INT}$ at its output terminal. Hence, as illustrated in the top half of FIG. 9, the bottom plate voltage $V_{BOT}$ for both capacitors C1 and C2 is set by the same control input $V_{INT}$ ($V_{BOT} = V_{INT}$). At this moment, the top plate voltage of the capacitor C1 becomes $$V_{INT} + \left(\frac{1}{2} V_{DD} - V_{OS1}\right),$$

and the top plate voltage of the capacitor C2 becomes $$V_{INT} - \left(\frac{1}{2} V_{DD} + V_{OS2}\right).$$

Next, charge re-distribution occurs among capacitors C1, C2, $C_{INT}$, such that $$\frac{1}{2} V_{DD} \cdot C$$

is transferred from the capacitor C1 to the capacitor C2, $C \cdot V_{OS1}$ is transferred from the integration capacitor $C_{INT}$ to the capacitor C1, and $C \cdot V_{OS2}$ is transferred from the integration capacitor $C_{INT}$ to the capacitor C2. After the charge re-distribution is done, the control input $V_{INT}$ held at the integration capacitor $C_{INT}$ is updated to $V_{INT,2}$ ($V_{INT,2} = V_{INT} - C \cdot (V_{OS1} + V_{OS2}) / C_{INT}$) as illustrated in the bottom half of FIG. 9. In addition, the unity-gain amplifier 204 sets the bottom plate voltage $V_{BOT}$ for both capacitors C1 and C2 by the same control input $V_{INT,2}$. Since the control input $V_{INT}$ held at the integration capacitor $C_{INT}$ is adjusted by the charge delivery operation performed by the unit-gain amplifier 204, the VCO 206 adjusts the frequency of the output clock CKOUT in response to the updated control input $V_{INT,2}$. For example, when the voltage difference $\Delta V$ ($\Delta V = V_{CN} - V_{CP}$) is positive, the VCO 206 may decrease the frequency of the output clock CKOUT. For another example, when the voltage difference $\Delta V$ ($\Delta V = V_{CN} - V_{CP}$) is negative, the VCO 206 may increase the frequency of the output clock CKOUT.

Figure 10:
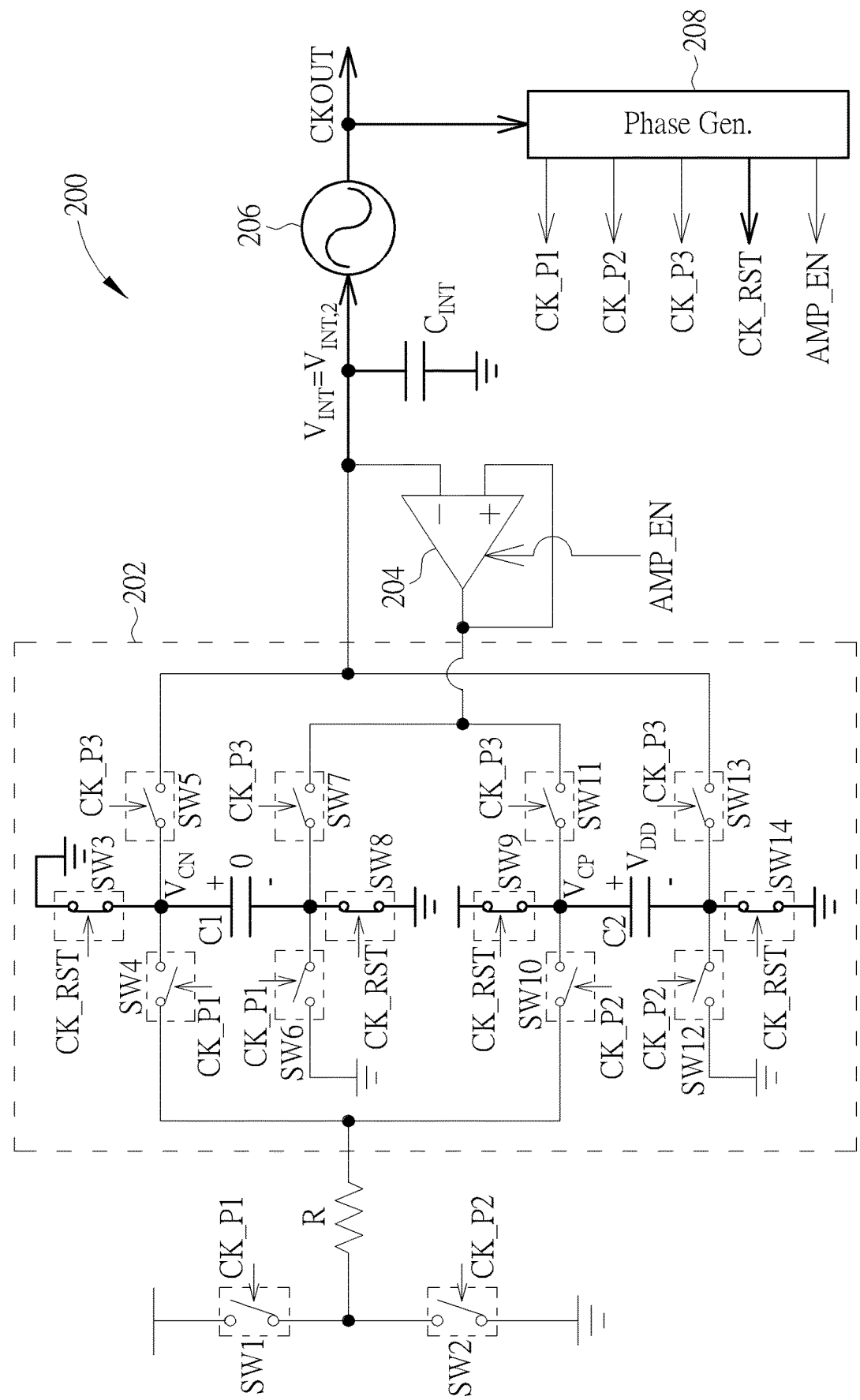
FIG. 10 is a diagram illustrating a relaxation oscillator operating under a reset phase according to an embodiment of the present invention.

After the charge delivery phase is completed, the relaxation oscillator 200 enters the reset phase for resetting the voltage $V_{CN}$ to an initial voltage level (e.g., reference voltage GND) and resetting the voltage $V_{CP}$ to an initial voltage level (e.g., reference voltage $V_{DD}$) for a next round of frequency deviation detection and calibration. FIG. 10 is a diagram illustrating the relaxation oscillator 200 operating under a reset phase according to an embodiment of the present invention. The switches SW3, SW8, SW9, SW14 are switched on by the switch control signal CK_RST (CK_RST=1). The switches SW1, SW4, SW6 are switched off by the switch control signal CK_P1 (CK_P1=0), such that one end of the resistor R is disconnected from the reference voltage $V_{DD}$, one plate of the capacitor C1 is disconnected from another end of the resistor R, and another plate of the capacitor C1 is disconnected from the reference voltage GND. The switches SW2, SW10, SW12 are switched off by the switch control signal CK_P2 (CK_P2=0), such that one end of the resistor R is disconnected from the reference voltage GND, one plate of the capacitor C2 is disconnected from another end of the resistor R, and another plate of the capacitor C2 is disconnected from the reference voltage GND. The switches SW5, SW7, SW11, SW13 are switched off by the switch control signal CK_P3 (CK_P3=0), such that two plates of the capacitor C1 and two plates of the capacitor C2 are all disconnected from the unity-gain amplifier 204. In addition, the unity-gain amplifier 204 is disabled by the amplifier enable control signal AMP_EN (AMP_EN=0).

During the period in which the reset operation is performed by the switched RC circuit 202, one plate of the capacitor C1 is connected to the reference voltage GND, another plate of the capacitor C1 is connected to the reference voltage GND, one plate of the capacitor C2 is connected to the reference voltage $V_{DD}$, and another plate of the capacitor C2 is connected to the reference voltage GND. Hence, during the period of the reset operation, the voltage $V_{CN}$ is discharged to the reference voltage GND, and the voltage $V_{CP}$ is charged to the reference voltage $V_{DD}$. At the end of the reset operation, the voltage $V_{CN}$ is equal to the reference voltage GND, and the voltage $V_{CP}$ is equal to the reference voltage $V_{DD}$. After the reset phase is completed, the relaxation oscillator 200 enters four phases (which include an RC charging phase, an RC discharging phase, a charge delivery phase, and a reset phase) again to reduce/cancel any frequency deviation still possessed by the output clock CKOUT.

Figure 11:
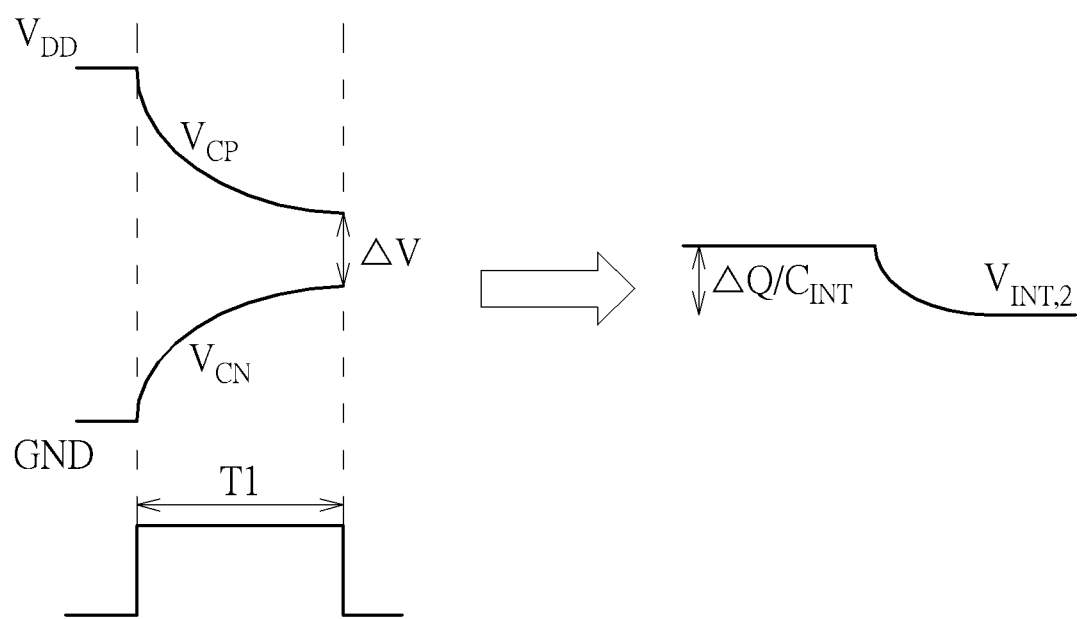
FIG. 11 is a diagram illustrating a scenario where a frequency of an output clock generated by a relaxation oscillator is deviated from a target frequency value.
Figure 12:
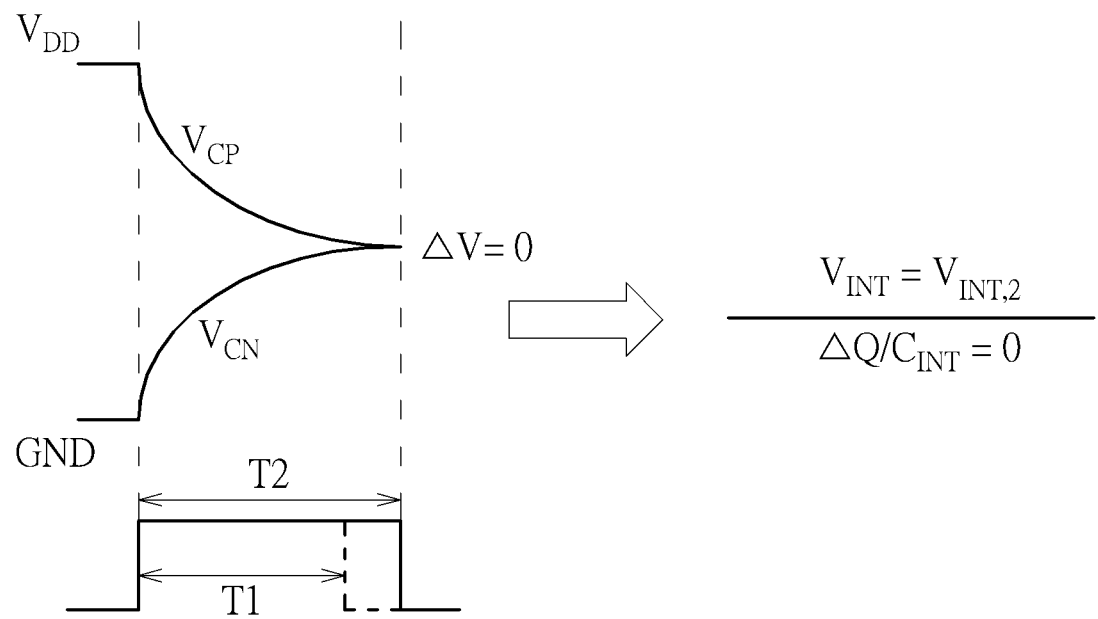
FIG. 12 is a diagram illustrating a scenario where the frequency of the output clock by the relaxation oscillator is equal to the target frequency value.

The frequency deviation of the output clock CKOUT is reflected in the voltage difference $\Delta V$ ($\Delta V = V_{CN} - V_{CP}$) between the voltage $V_{CN}$ obtained at the end of the RC charging operation and the voltage $V_{CP}$ obtained at the end of the RC discharging operation. Hence, to reduce the non-zero frequency deviation of the output clock CKOUT as indicated by the non-zero voltage difference $\Delta V$, the control input $V_{INT}$ of the VCO 206 needs to be adjusted by the non-zero voltage difference $\Delta V$. FIG. 11 is a diagram illustrating a scenario where the frequency of the output clock CKOUT is deviated from the target frequency value. FIG. 12 is a diagram illustrating a scenario where the frequency of the output clock CKOUT is equal to the target frequency value. Assuming that the current frequency of the output clock CKOUT is higher than the target frequency value, the ON period of the switch control signal CK_P1/CK_P2 is equal to T1 that is shorter than T2. Hence, there is a positive voltage difference $\Delta V$ between the voltage $V_{CN}$ obtained at the end of the RC charging operation and the voltage $V_{CP}$ obtained at the end of the RC discharging operation, that is, $\Delta V = V_{CN} - V_{CP} > 0$. The positive voltage difference $\Delta V$ ($\Delta V = \Delta Q / C_{INT}$) is transferred to the integration capacitor $C_{INT}$. Hence, the positive voltage difference $\Delta V$ is subtracted from the current control input $V_{INT}$, resulting in an updated control input $V_{INT,2}$ with a lower voltage level. In response to the updated control input $V_{INT,2}$, the VCO 206 generates the output clock CKOUT with a lower frequency, which increases the ON period of the switch control signal CK_P1/CK_P2. Suppose that the frequency of the output clock CKOUT is equal to the target frequency value under the control of the updated control input $V_{INT,2}$ fed into the VCO 206. Since the ON period of the switch control signal CK_P1/CK_P2 is equal to T2, there is no voltage difference $\Delta V$ ($\Delta V = 0$) between the voltage $V_{CN}$ obtained at the end of the RC charging operation and the voltage $V_{CP}$ obtained at the end of the RC discharging operation, such that no voltage adjustment is made to the current control input $V_{INT}$ ($V_{INT} = V_{INT,2}$).

Figure 13:
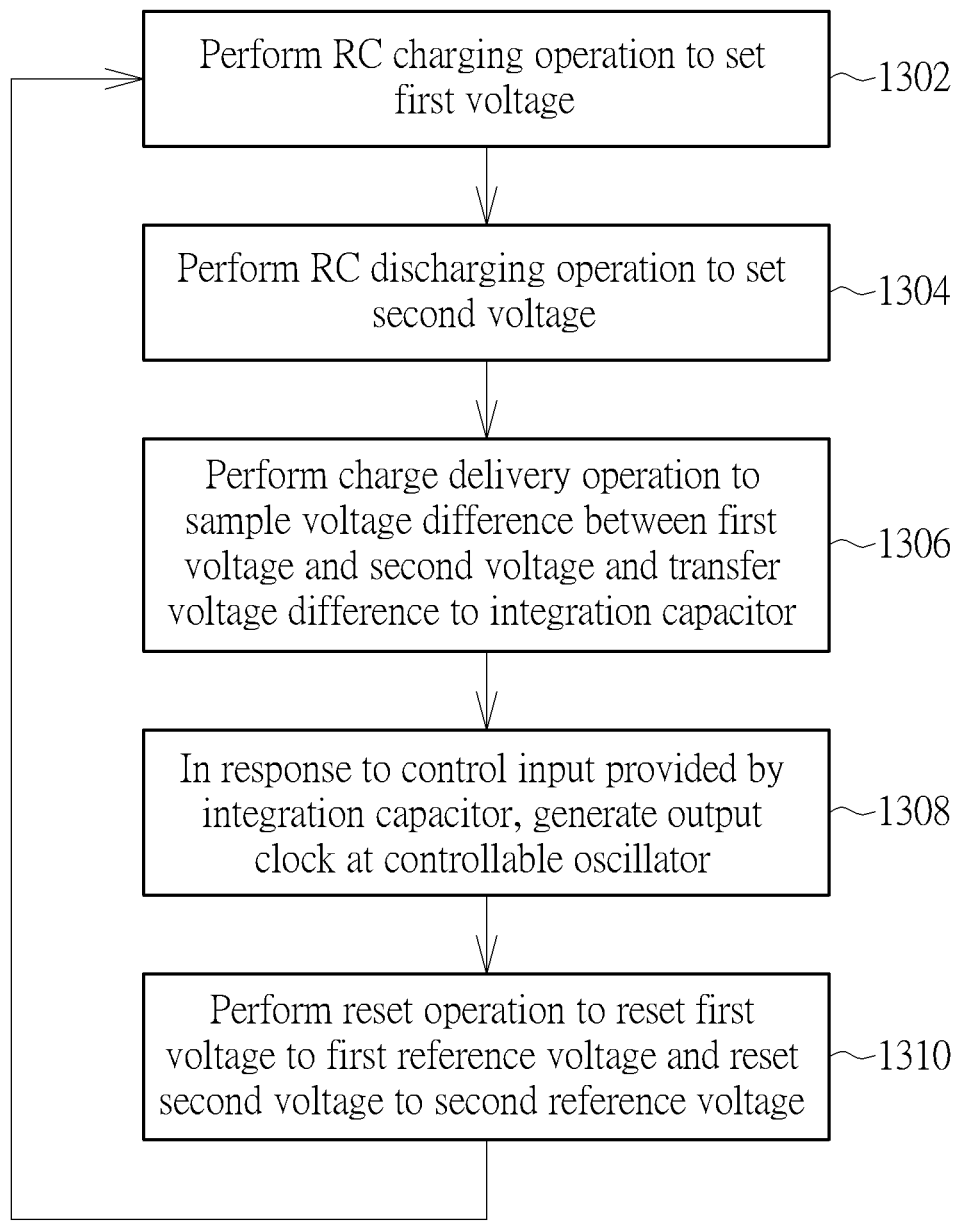
FIG. 13 is a flowchart illustrating a relaxation oscillation method according to an embodiment of the present invention.

FIG. 13 is a flowchart illustrating a relaxation oscillation method according to an embodiment of the present invention. The relaxation oscillation method may be employed by the relaxation oscillator 100/200. Provided that the result is substantially the same, the steps are not required to be executed in the exact order shown in FIG. 13. At step 1302, a resistor-capacitor (RC) charging operation is performed to set a first voltage. At step 1304, an RC discharging operation is performed to set a second voltage. At step 1306, a charge delivery operation is performed to sample a voltage difference between the first voltage and the second voltage and transfer the voltage difference to an integration capacitor. At step 1308, an output clock is generated at a controllable oscillator in response to a control input provided by the integration capacitor. At step 1310, a reset operation is performed to reset the first voltage to a first reference voltage and reset the second voltage to a second reference voltage. As a person skilled in the art can readily understand details of each step after reading above paragraphs directed to the relaxation oscillator 100/200, further description is omitted here for brevity.

In above embodiments, the RC charging operation (RC charging phase) is followed by the RC discharging operation (RC discharging phase). However, this is for illustrative purposes only, and is not meant to be a limitation of the present invention. Alternatively, the RC discharging operation (RC discharging phase) may be followed by the RC charging operation (RC charging phase). The same objective of creating two voltages $V_{CN}$ and $V_{CP}$ to indicate a frequency status of the output clock CKOUT before the charge delivery operation (charge delivery) is achieved. This alternative design also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A relaxation oscillator comprising:
 a resistor-capacitor (RC) circuit, arranged to perform an RC charging operation to set a first voltage, perform an RC discharging operation to set a second voltage, and perform a reset operation to reset the first voltage to a first reference voltage and reset the second voltage to a second reference voltage;
 an integration capacitor;
 a sampling circuit, arranged to perform a charge delivery operation to sample a voltage difference between the first voltage and the second voltage and transfer the voltage difference to the integration capacitor; and
 a controllable oscillator, arranged to generate an output clock in response to a control input provided by the integration capacitor;
 wherein the RC discharging operation is performed during one period: the reset operation is performed during another period; and said one period and said another period are non-overlapping periods.

2. The relaxation oscillator of claim 1, wherein the RC charging operation is performed during a first period; the RC discharging operation is performed during a second period being said one period; the charge delivery operation is performed during a third period; the reset operation is performed during a fourth period being said another period; and the first period, the second period, the third period, and the fourth period are non-overlapping periods.

3. The relaxation oscillator of claim 1, wherein the RC circuit is a switched RC circuit comprising:
 a resistor;
 a first capacitor, have one plate at which the first voltage is held;
 a second capacitor, having one plate at which the second voltage is held; and
 a switch network;
 wherein during a period in which the RC charging operation is performed, the switch network is configured to connect the resistor to the first capacitor and disconnect the resistor from the second capacitor; and during a period in which the RC discharging operation is performed, the switch network is configured to connect the resistor to the second capacitor and disconnect the resistor from the first capacitor.

4. The relaxation oscillator of claim 3, wherein the switch network comprises:
a switch-based circuit, wherein during the period in which the RC charging operation is performed, the switch-based circuit is configured to connect one end of the resistor to the second reference voltage, connect said one plate of the first capacitor to another end of the resistor, and connect another plate of the first capacitor to the first reference voltage; and during a period in which the RC charging operation is not performed, the switch-based circuit is configured to disconnect said one end of the resistor from the second reference voltage, disconnect said one plate of the first capacitor from said another end of the resistor, and disconnect said another plate of the first capacitor from the first reference voltage.

5. The relaxation oscillator of claim 4, further comprising:
a control signal generator circuit, arranged to generate a switch control signal according to the output clock, and provide the switch control signal to the switch-based circuit, wherein a frequency of the switch control signal is lower than a frequency of the output clock.

6. The relaxation oscillator of claim 3, wherein the switch network comprises:
a switch-based circuit, wherein during the period in which the RC discharging operation is performed, the switch-based circuit is configured to connect one end of the resistor to the first reference voltage, connect said one plate of the second capacitor to another end of the resistor, and connect another plate of the second capacitor to the first reference voltage; and during a period in which the RC discharging operation is not performed, the switch-based circuit is configured to disconnect said one end of the resistor from the first reference voltage, disconnect said one plate of the second capacitor from said another end of the resistor, and disconnect said another plate of the second capacitor from the first reference voltage.

7. The relaxation oscillator of claim 6, further comprising:
a control signal generator circuit, arranged to generate a switch control signal according to the output clock, and provide the switch control signal to the switch-based circuit, wherein a frequency of the switch control signal is lower than a frequency of the output clock.

8. The relaxation oscillator of claim 3, wherein the switch network comprises:
a switch-based circuit, wherein during a period in which the charge delivery operation is performed, the switch-based circuit is configured to connect said one plate of the first capacitor, another plate of the first capacitor, said one plate of the second capacitor, and another plate of the second capacitor to the sampling circuit; and during a period in which the charge delivery operation is not performed, the switch-based circuit is configured to disconnect said one plate of the first capacitor, said another plate of the first capacitor, said one plate of the second capacitor, and said another plate of the second capacitor from the sampling circuit.

9. The relaxation oscillator of claim 8, further comprising:
a control signal generator circuit, arranged to generate a switch control signal according to the output clock, and provide the switch control signal to the switch-based circuit, wherein a frequency of the switch control signal is lower than a frequency of the output clock.

10. The relaxation oscillator of claim 8, wherein the sampling circuit comprises:
a unity-gain amplifier, having a non-inverting input terminal, an inverting input terminal, and an output terminal, where the output terminal is coupled to the non-inverting input terminal, and the inverting input terminal is coupled to the integration capacitor;
during the period in which the charge delivery operation is performed, the switch-based circuit is configured to connect said one plate of the first capacitor and said another plate of the second capacitor to the inverting input terminal of the unity-gain amplifier, and is further configured to connect said another plate of the first capacitor and said one plate of the second capacitor to the output terminal of the unity-gain amplifier; and
during the period in which the charge delivery operation is not performed, the switch-based circuit is configured to disconnect said one plate of the first capacitor and said another plate of the second capacitor from the inverting input terminal of the unity-gain amplifier, and is further configured to disconnect said another plate of the first capacitor and said one plate of the second capacitor from the output terminal of the unity-gain amplifier.

11. The relaxation oscillator of claim 10, wherein the inverting input terminal of the unity-gain amplifier is coupled to one plate of the integration capacitor, another plate of the integration capacitor is coupled to the first reference voltage, and the control input of the controllable oscillator is held at said one plate of the integration capacitor.

12. The relaxation oscillator of claim 10, wherein the unity-gain amplifier is enabled during the period in which the charge delivery operation is performed, and is disabled during the period in which the RC charging operation is performed, the period in which the RC discharging operation is performed, and a period in which the reset operation is performed.

13. The relaxation oscillator of claim 10, further comprising:
a control signal generator circuit, arranged to generate an amplifier enable control signal according to the output clock, and provide the amplifier enable control signal to the unity-gain amplifier, wherein a frequency of the amplifier enable control signal is lower than a frequency of the output clock.

14. The relaxation oscillator of claim 3, wherein the switch network comprises:
a switch-based circuit, wherein during a period in which the reset operation is performed, the switch-based circuit is configured to connect said one plate of the first capacitor to the first reference voltage, connect another plate of the first capacitor to the first reference voltage, connect said one plate of the second capacitor to the second reference voltage, and connect another plate of the second capacitor to the first reference voltage; and during a period in which the reset operation is not performed, the switch-based circuit is configured to disconnect said one plate of the first capacitor from the first reference voltage, disconnect said another plate of the first capacitor from the first reference voltage, disconnect said one plate of the second capacitor from the second reference voltage, and disconnect said another plate of the second capacitor from the first reference voltage.

15. The relaxation oscillator of claim 14, further comprising:
a control signal generator circuit, arranged to generate a switch control signal according to the output clock, and provide the switch control signal to the switch-based circuit, wherein a frequency of the switch control signal is lower than a frequency of the output clock.

16. A relaxation oscillation method comprising:
performing a resistor-capacitor (RC) charging operation to set a first voltage;
performing an RC discharging operation to set a second voltage;
performing a charge delivery operation to sample a voltage difference between the first voltage and the second voltage and transfer the voltage difference to an integration capacitor;
in response to a control input provided by the integration capacitor, generating an output clock at a controllable oscillator; and
performing a reset operation to reset the first voltage to a first reference voltage and reset the second voltage to a second reference voltage;
wherein the RC discharging operation is performed during one period; the reset operation is performed during another period; and said one period and said another period are non-overlapping periods.

17. A relaxation oscillation method comprising:
performing a resistor-capacitor (RC) charging operation to set a first voltage;
performing an RC discharging operation to set a second voltage;
performing a charge delivery operation to sample a voltage difference between the first voltage and the second voltage and transfer the voltage difference to an integration capacitor;
in response to a control input provided by the integration capacitor, generating an output clock at a controllable oscillator; and
performing a reset operation to reset the first voltage to a first reference voltage and reset the second voltage to a second reference voltage;
wherein the RC charging operation is performed once per N clock cycles of the output clock, where N is an integer larger than one.

18. A relaxation oscillation method comprising:
performing a resistor-capacitor (RC) charging operation to set a first voltage;
performing an RC discharging operation to set a second voltage;
performing a charge delivery operation to sample a voltage difference between the first voltage and the second voltage and transfer the voltage difference to an integration capacitor;
in response to a control input provided by the integration capacitor, generating an output clock at a controllable oscillator; and
performing a reset operation to reset the first voltage to a first reference voltage and reset the second voltage to a second reference voltage;
wherein the RC discharging operation is performed once per N clock cycles of the output clock, where N is an integer larger than one.

19. A relaxation oscillation method comprising:
performing a resistor-capacitor (RC) charging operation to set a first voltage;
performing an RC discharging operation to set a second voltage;
performing a charge delivery operation to sample a voltage difference between the first voltage and the second voltage and transfer the voltage difference to an integration capacitor;
in response to a control input provided by the integration capacitor, generating an output clock at a controllable oscillator; and
performing a reset operation to reset the first voltage to a first reference voltage and reset the second voltage to a second reference voltage;
wherein the charge delivery operation is performed once per N clock cycles of the output clock, where N is an integer larger than one.

20. A relaxation oscillation method comprising:
performing a resistor-capacitor (RC) charging operation to set a first voltage;
performing an RC discharging operation to set a second voltage;
performing a charge delivery operation to sample a voltage difference between the first voltage and the second voltage and transfer the voltage difference to an integration capacitor;
in response to a control input provided by the integration capacitor, generating an output clock at a controllable oscillator; and
performing a reset operation to reset the first voltage to a first reference voltage and reset the second voltage to a second reference voltage;
wherein the reset operation is performed once per N clock cycles of the output clock, where N is an integer larger than one.

* * * * *